(12) United States Patent
Lee

(10) Patent No.: US 12,727,343 B2
(45) Date of Patent: Sep. 1, 2026

(54) SUBSTRATE, DISPLAY PANEL INCLUDING THE SAME, AND ELECTRONIC DEVICE INCLUDING THE SAME

(71) Applicant: Samsung Display Co., Ltd., Yongin-si (KR)

(72) Inventor: Hee Chul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/169,693

(22) Filed: Apr. 3, 2025

(65) Prior Publication Data

US 2025/0318370 A1 Oct. 9, 2025

(30) Foreign Application Priority Data

Apr. 8, 2024 (KR) ........................ 10-2024-0047216

(51) Int. Cl.

*H10K 59/126* (2023.01)
*G09G 3/3225* (2016.01)
*H05K 9/00* (2006.01)
*H10K 59/131* (2023.01)
*H10K 71/50* (2023.01)
*H10K 77/10* (2023.01)

(52) U.S. Cl.

CPC ......... *H10K 59/126* (2023.02); *G09G 3/3225* (2013.01); *H05K 9/0064* (2013.01); *H10K 59/131* (2023.02); *H10K 71/50* (2023.02); *H10K 77/111* (2023.02); *G09G 2330/06* (2013.01)

(58) Field of Classification Search

CPC ............. G09G 3/3225; G09G 2330/06; H05K 9/0064; H10K 59/126; H10K 59/131; H10K 71/50; H10K 77/111

See application file for complete search history.

(56) References Cited

U.S. PATENT DOCUMENTS

| | | | | |
|---|---|---|---|---|
| 10,921,857 | B2 | 2/2021 | Kim et al. | |
| 2002/0022156 | A1* | 2/2002 | Bright | C23C 16/0272 428/458 |
| 2013/0208017 | A1* | 8/2013 | Gu | G09G 3/3208 345/690 |
| 2019/0005856 | A1* | 1/2019 | Wang | G09F 9/301 |
| 2020/0295115 | A1* | 9/2020 | Zhu | H10K 71/00 |
| 2021/0134931 | A1* | 5/2021 | Kim | H10K 59/871 |
| 2024/0114762 | A1* | 4/2024 | Song | H10K 50/80 |

FOREIGN PATENT DOCUMENTS

KR 10-2441330 B1 9/2022

OTHER PUBLICATIONS

Hao, et al., "Breakdown voltage of ultrathin dielectric film subject to electrostatic discharge stress," Journal of Applied Physics, vol. 110, 2011, 5 pages.
Kunic, et al., "OLED Technology and Displays," 54th International Symposium ELMAR-2012, Sep. 2012, pp. 31-35.
Pionteck, et al., "Handbook of Antistatics," ChemTec Publishing, 2016, 8 pages.

* cited by examiner

*Primary Examiner* — Cory A Almeida

(74) *Attorney, Agent, or Firm* — Womble Bond Dickinson (US) LLP

(57) ABSTRACT

A substrate including: a first base layer; an adhesive layer on the first base layer, the adhesive layer including at least one trench; a second base layer on the adhesive layer; and a barrier overlapping with the at least one trench, the at least one trench penetrating the adhesive layer.

20 Claims, 14 Drawing Sheets

EA_S: EA_S1, EA_S2, EA_S3, EA_S4
BU": BU1, BU2, BU3
TRH": TRH1, TRH2, TRH3

SUB: GL, BL1, AL ,BL2, BU

SUBSTRATE, DISPLAY PANEL INCLUDING THE SAME, AND ELECTRONIC DEVICE INCLUDING THE SAME

CROSS-REFERENCE TO RELATED APPLICATION

The present application claims priority to and the benefit of Korean patent application No. 10-2024-0047216, filed on Apr. 8, 2024, in the Korean Intellectual Property Office, the entire disclosure of which is incorporated by reference herein.

BACKGROUND

1. Field

Aspects of embodiments of the present disclosure relate to a substrate, a display panel including the substrate, and an electronic device including the substrate.

2. Description of the Related Art

With the development of technologies, a display device may include an electronic component for performing various functions therein. While the electronic component is driven, at least a portion of electromagnetic waves (e.g., static electricity) may be generated, and the corresponding electromagnetic waves may be introduced into the display device.

The above information disclosed in this Background section is for enhancement of understanding of the background of the present disclosure, and therefore, it may contain information that does not constitute prior art.

SUMMARY

When a substrate of a display device is formed of plastic, the substrate may be weaker to (e.g., may be more influenced by) static electricity. For example, the introduced electromagnetic waves may charge at least a portion of the substrate. Accordingly, an operation of the electronic component may be influenced, and a risk that the reliability of driving of the display device will be deteriorated may occur.

Embodiments of the present disclosure may be directed to a substrate, a display panel, and a display device, in which static electricity introduced from the outside is relatively stably shielded, thereby improving the reliability of driving.

According to one or more embodiments of the present disclosure, a substrate includes: a first base layer; an adhesive layer on the first base layer, the adhesive layer including at least one trench; a second base layer on the adhesive layer; and a barrier overlapping with the at least one trench. The at least one trench penetrates the adhesive layer.

In an embodiment, the barrier may be located on an edge area surrounding a central area of the substrate.

In an embodiment, the central area may include: a first side; a second side opposite to the first side; a third side connected to the first side and the second side; and a fourth side opposite to the third side. The barrier may include: a first barrier adjacent to a corner between the first side and the fourth side; a second barrier adjacent to a corner between the second side and the third side; and a third barrier adjacent to a corner between the first side and the third side.

In an embodiment, the barrier may include a dielectric material.

In an embodiment, the first base layer and the second base layer may have a flexibility.

In an embodiment, the first base layer and the second base layer may include polyimide.

In an embodiment, the adhesive layer may include amorphous silicon.

According to one or more embodiments of the present disclosure, a display panel includes: a ground layer; a first base layer on the ground layer; an adhesive layer on the first base layer; a second base layer on the adhesive layer; and a barrier in contact with one surface of the adhesive layer, and connected to the ground layer.

In an embodiment, the barrier may surround a display area, and may be located on a non-display area different from the display area.

In an embodiment, the barrier may be in contact with the first base layer.

In an embodiment, the barrier may be in contact with the second base layer.

In an embodiment, the ground layer may have a ground potential.

According to one or more embodiments of the present disclosure, an electronic device includes: a processor to provide input image data; and a display device to display an image based on the input image data, a display device includes: a ground layer; a first base layer; an adhesive layer on the first base layer, and including at least one trench; a second base layer on the adhesive layer; and a barrier overlapping with the at least one trench, and penetrating the adhesive layer.

In an embodiment, the ground layer may have a ground potential.

In an embodiment, the barrier may have an electrical conductivity higher than an electrical conductivity of the adhesive layer.

In an embodiment, the barrier may surround a display area, and may be located on a non-display area different from the display area.

In an embodiment, the barrier may be connected to the ground layer through a connection line.

In an embodiment, the connection line may overlap with the non-display area.

In an embodiment, the electronic device may further include: a display panel configured to display an image through the display area; and a data driver configured to supply a data signal to the display panel, and located at one side of the display panel. The barrier may not be located at the one side of the display panel.

In an embodiment, the electronic device may further include a bias supplier configured to supply a bias voltage to the barrier, and the bias voltage may have a low level voltage during a period.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
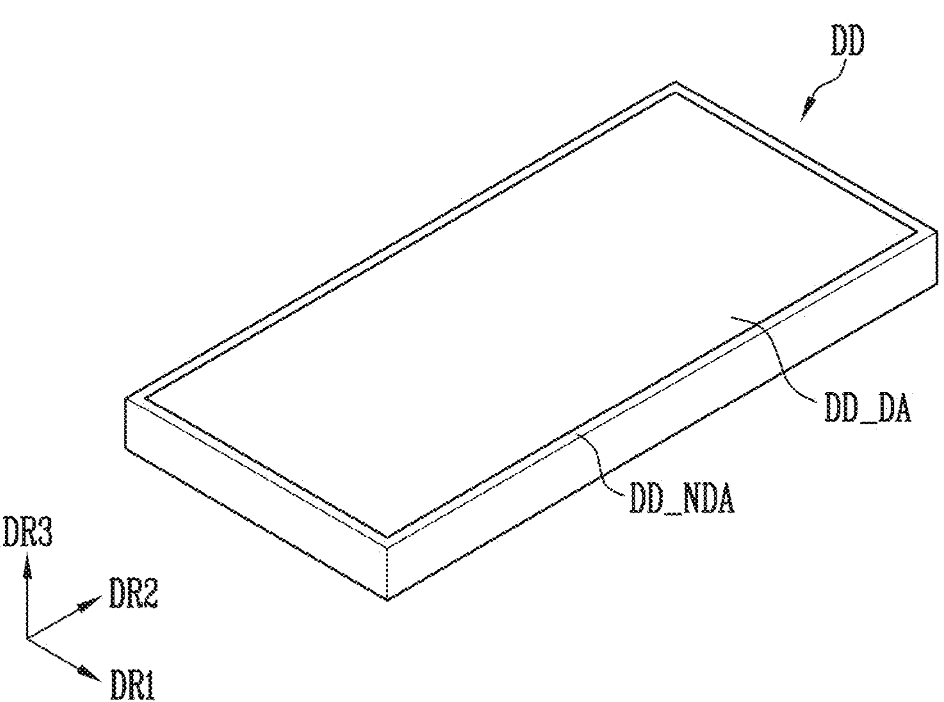
FIG. 1 is a schematic perspective view illustrating a display device in accordance with an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it should be expected that the shapes shown in the figures may vary in practice depending, for example, on tolerances and/or manufacturing techniques. Accordingly, the embodiments of the present disclosure should not be construed as being limited to the specific shapes shown in the figures, and should be construed considering changes in shapes that may occur, for example, as a result of manufacturing. As such, the shapes shown in the drawings may not depict the actual shapes of areas of the device, and the present disclosure is not limited thereto.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
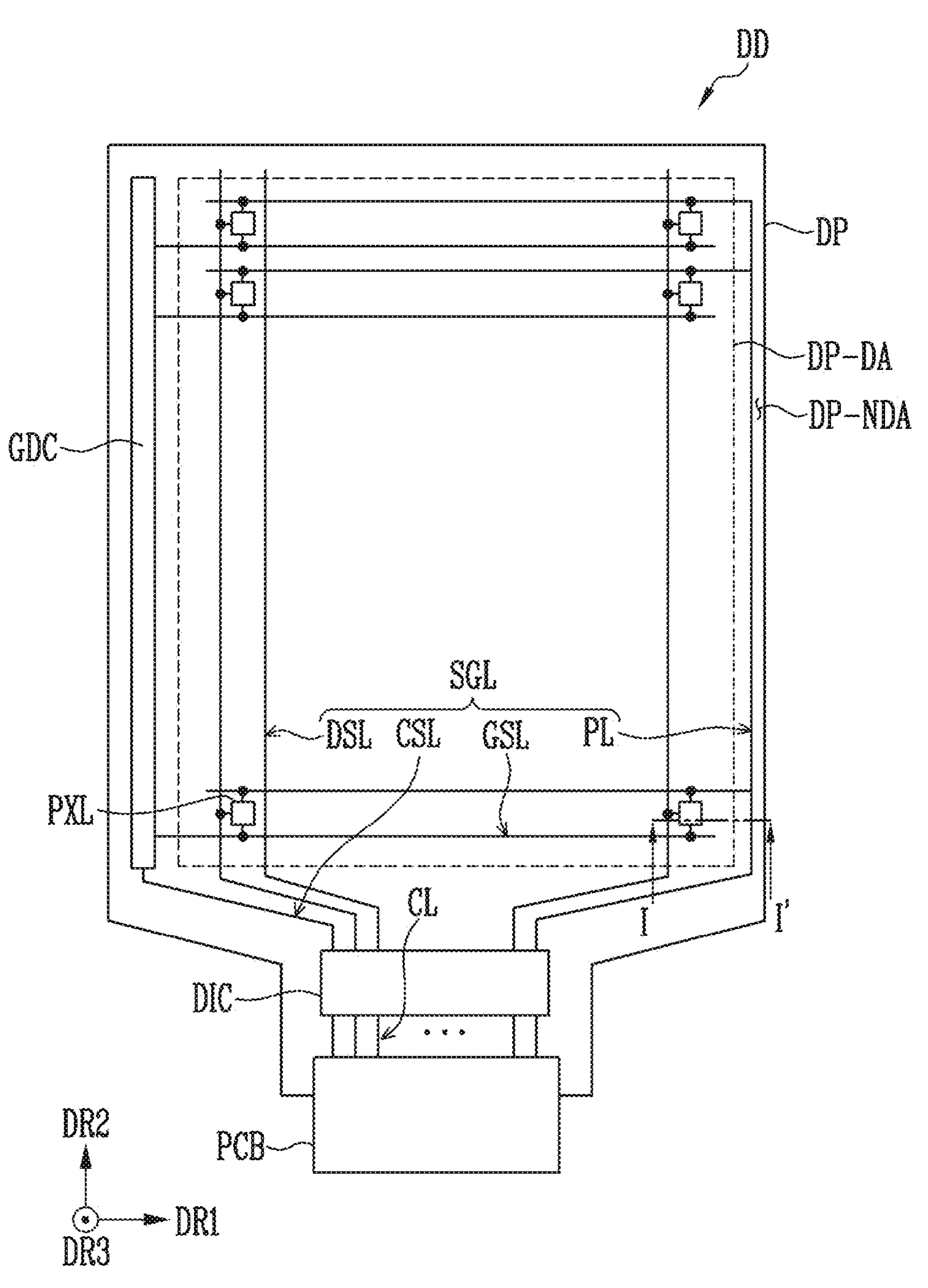
FIG. 2 is a plan view illustrating components of the display device shown in FIG. 1.

FIG. 1 is a schematic perspective view illustrating a display device in accordance with an embodiment of the present disclosure. FIG. 2 is a plan view illustrating components of the display device shown in FIG. 1.

Referring to FIG. 1, the display device DD may include a display area DD_DA in which an image is displayed, and a non-display area DD_NDA provided at (e.g., in or on) at least one side of the display area DD_DA. The non-display area DD_NDA may be an area in which the image is not displayed.

The display device DD shown in FIG. 1 may be provided in various suitable shapes. For example, the display device DD may be provided in a rectangular plate shape having two pairs of parallel or substantially parallel sides, but the present disclosure is not limited thereto. When the display device DD is provided in the rectangular plate shape, any one pair of the sides from among the two pairs of sides may be provided to be longer than the other pair of sides. In some embodiments, for convenience of illustration, the display device DD is shown in a rectangular shape having a pair of long sides and a pair of short sides. An extending direction of the long side is indicated as a second direction DR2. An extending direction of the short side is indicated as a first direction DR1. A thickness direction of the display device DD is indicated as a third direction DR3. In the display device DD that is provided in the rectangular plate shape, a corner portion at which one long side and one short side are in contact with each other may have a rounded shape.

At least a portion of the display device DD may have a flexibility. For example, the display device DD may include a portion having a flexibility, and the portion of the display device DD having the flexibility may be bent. However, the present disclosure is not limited thereto.

Referring to FIG. 2, the display device DD may include a display panel DP (e.g., a display unit or a pixel unit), a driving circuit chip DIC, and a printed circuit board PCB.

The display panel DP may include a display area DP_DA in which an image is displayed, and a non-display area DP_NDA located at the periphery of the display area DP_DA.

The display panel DP may include a plurality of pixels PXL. For example, the display panel DP may include the pixels PXL disposed on the display area DP_DA. Each pixel PXL may include at least one light emitting element, and a pixel circuit for driving the light emitting element. The pixel circuit may include, for example, a switching transistor for transferring a data signal in response to a gate signal, a storage capacitor for storing the data signal transferred through the switching transistor, a driving transistor for providing a driving current corresponding to the stored data signal to the at least one light emitting element, and the like.

The display panel DP may include a plurality of signal lines SGL. The signal lines SGL may include gate lines GSL, data lines DSL, a power line PL, and a control signal line CSL. The power line PL may be connected to the pixels PXL. The control signal line CSL may provide control signals to a scan driving circuit GDC.

Each of the gate lines GSL may be connected to a corresponding pixel from among the pixels PXL. Each of the data lines DSL may be connected to a corresponding pixel from among the pixels PXL. For example, any one of the pixels PXL may be connected to a gate line GSL and a data line DSL, and may emit light having a luminance corresponding to a data signal (e.g., a data voltage) in response to a gate signal. The gate signal may be provided through the gate line GSL, and the data signal may be provided through the data line DSL.

The gate lines GSL may extend in the first direction DR1, and may be arranged along the second direction DR2. The data lines DSL may extend in the second direction DR2, and may be arranged along the first direction DR1.

The scan driving circuit GDC may generate a plurality of gate signals, and may sequentially output the gate signals to the gate lines GSL. A gate signal may include a start pulse and a clock signal (e.g., a scan clock signal and a carry clock signal).

The driving circuit chip DIC may be disposed at one side of the display panel DP. For example, the driving circuit chip DIC may be disposed at one side of the display panel DP in the opposite direction of the second direction DR2. Accordingly, the one side of the display panel DP may not be weak to static electricity introduced from the outside. For example, at least a portion of the static electricity introduced into the display panel DP from the outside may be blocked by the driving circuit chip DIC disposed at the one side of the display panel DP.

The driving circuit chip DIC may be connected to the data lines DSL and the control signal line CSL. In some embodiments, the driving circuit chip DIC may include a data driving circuit for generating a data signal.

The driving circuit chip DIC and the printed circuit board PCB may exchange an electrical signal with each other. For example, the driving circuit chip DIC and the printed circuit board PCB may include signal lines CL. The driving circuit chip DIC may receive a data control signal and image data from the printed circuit board PCB through the signal lines CL. Accordingly, the driving circuit chip DIC may generate a data signal corresponding to the image data. The driving circuit chip DIC may provide the generated data signal to the display panel DP. The image data may be generated by realigning input data (e.g., original image data) provided from the outside (e.g., from a processor).

Figure 3:
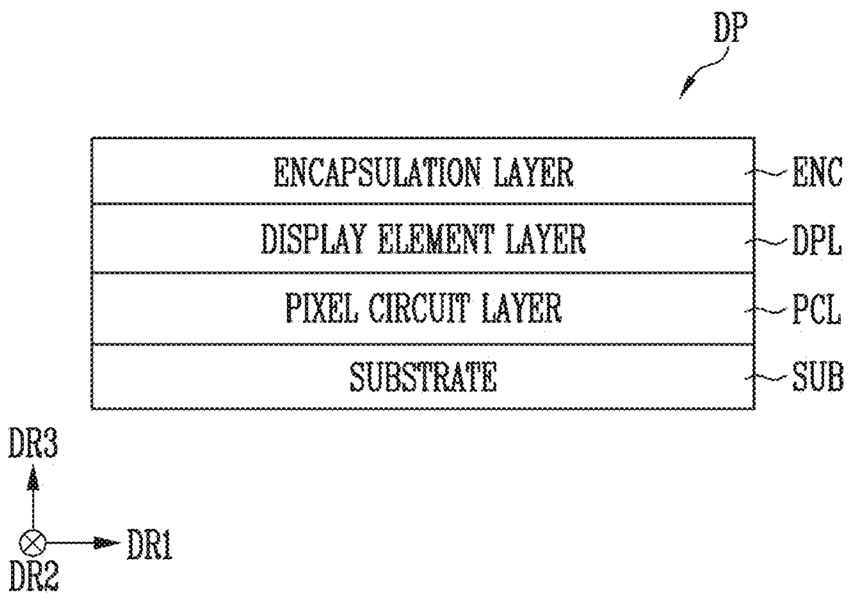
FIG. 3 is a sectional view schematically illustrating a stacked structure of a display panel shown in FIG. 2.

FIG. 3 is a sectional view schematically illustrating a stacked structure of the display panel shown in FIG. 2.

Referring to FIG. 3, the display panel DP may include a substrate SUB, a pixel circuit layer PCL, a display element layer DPL, and an encapsulation layer ENC.

The substrate SUB may constitute a bottom surface of the display panel DP. The pixel circuit layer PCL, the display element layer DPL, and the encapsulation layer ENC may be sequentially disposed on the substrate SUB. However, the present disclosure is not limited thereto. For example, a layer other than (e.g., except for) the pixel circuit layer PCL, the display element layer DPL, and the encapsulation layer ENC, which are shown in FIG. 3, may be disposed on the substrate SUB.

The pixel circuit layer PCL may be provided on the substrate SUB, and may include a plurality of transistors, and signal lines connected to the transistors. For example, each transistor may be provided in a form in which a semiconductor layer, a gate electrode, a first terminal, and a second terminal are sequentially stacked with an insulating layer interposed therebetween. The semiconductor layer may include amorphous silicon, monocrystalline silicon, polycrystalline silicon, low temperature poly-silicon, an organic semiconductor, and/or an oxide semiconductor. The gate electrode, the first terminal, and the second terminal may include one of aluminum (Al), copper (Cu), titanium (Ti), and/or molybdenum (Mo), but the present disclosure is not limited thereto. Also, the pixel circuit layer PCL may include at least one insulating layer.

The display element layer DPL may be disposed on the pixel circuit layer PCL. The display element layer DPL may include a light emitting element for emitting light. The light emitting element may include an organic light emitting diode, an inorganic light emitting diode, or the like. However, the present disclosure is not limited thereto. For example, the light emitting element may include a quantum dot light emitting diode or the like.

The encapsulation layer ENC may be disposed on the display element layer DPL. The encapsulation layer ENC may be an encapsulation substrate, or may be provided in the form of an encapsulation layer formed as a multi-layered structure. When the encapsulation layer ENC is provided in the form of the encapsulation layer, the encapsulation layer ENC may include an inorganic layer and/or an organic layer. For example, the encapsulation layer ENC may be provided in a form in which an inorganic layer, an organic layer, and an inorganic layer are sequentially stacked. The encapsulation layer ENC may prevent or substantially prevent external air and/or moisture from infiltrating into the display element layer DPL and the pixel circuit layer PCL.

Figure 4:
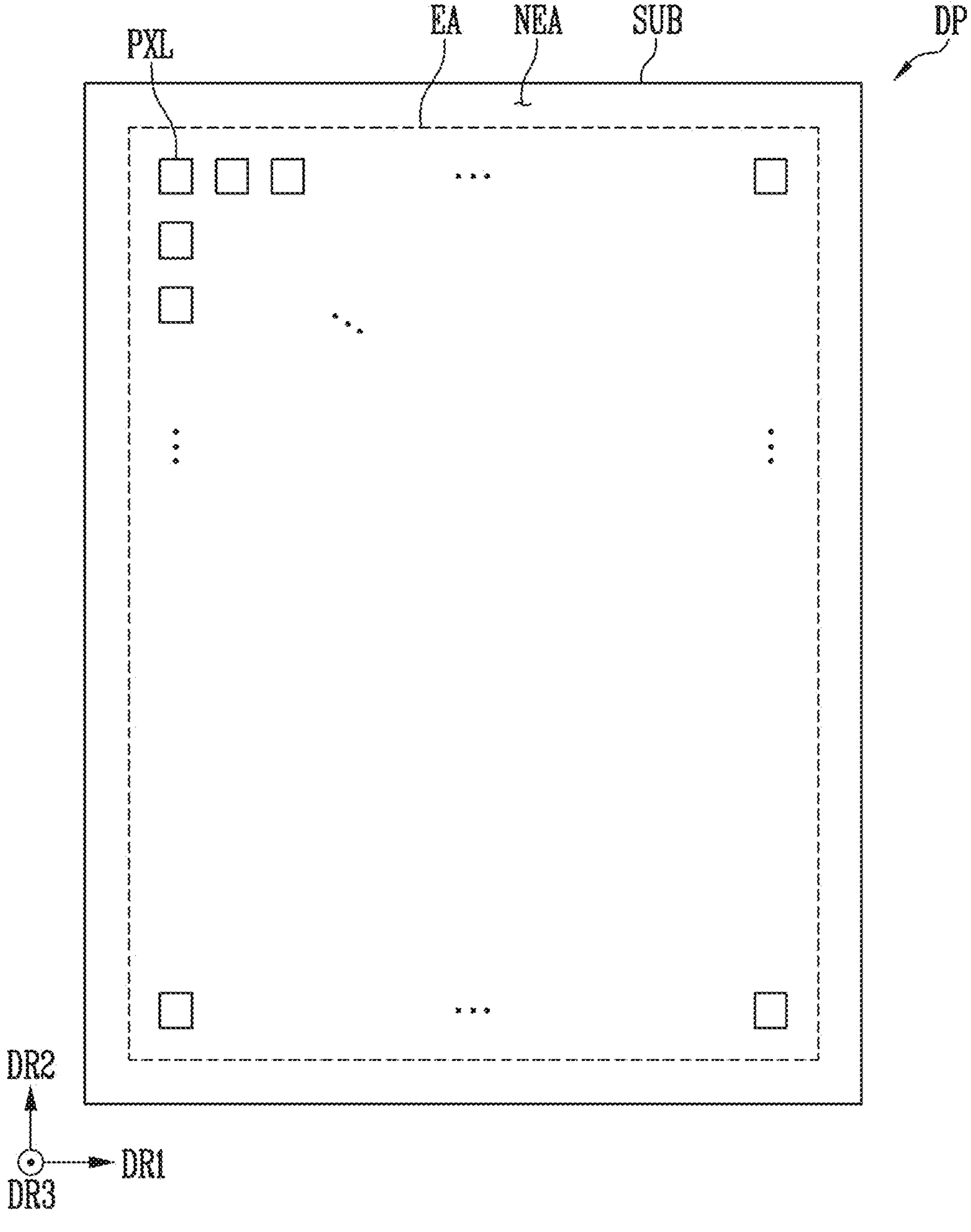
FIG. 4 is a plan view illustrating an embodiment of a substrate included in the display panel shown in FIG. 2.

FIG. 4 is a plan view illustrating an embodiment of a substrate included in the display panel shown in FIG. 2.

Referring to FIG. 4, the display panel DP may include a substrate SUB, and a plurality of pixels PXL provided on the substrate SUB. The substrate SUB shown in FIG. 4 may be the same or substantially the same as the substrate SUB described above with reference to FIG. 3. Accordingly, redundant description thereof may not be repeated hereinafter.

The substrate SUB may be formed as an area (e.g., as one area) having a rectangular shape. However, the number of areas provided in the substrate SUB may be variously modified as needed or desired, and the shape of the substrate SUB may be variously modified according to the area(s) provided in the substrate SUB.

The substrate SUB may include (e.g., may be made of) a suitable material having a flexibility to be bendable or foldable, and may have a single-layer structure or a multi-layered structure. For example, the substrate SUB may include a polyimide substrate. However, the material constituting the substrate SUB is not limited to thereto. For example, the substrate SUB may include (e.g., may be made of) an insulative material, such as glass or resin.

The substrate SUB may include a display area (e.g., a central area) EA and a non-display area (e.g., an edge area) NEA. The display area EA may be an area where the pixels PXL are provided to display an image, and the non-display area NEA may be an area in which the pixels PXL are not provided so that the image is not displayed in the non-display area NEA. The display area EA and the non-display area NEA, which are shown in FIG. 4, may correspond to the display area DP_DA and the non-display area DP_NDA described above with reference to FIG. 2, respectively. Also, the display area EA and the non-display area NEA, which are shown in FIG. 4, may correspond to the display area DD_DA and the non-display area DD_NDA of the display device DD described above with reference to FIG. 1, respectively.

The non-display area NEA may correspond to a bezel area of the display device DD. A driving unit (e.g., a driver, a driving circuit, or a driving integrated circuit) for driving the pixels PXL, and a portion of a line unit (e.g., fan-out lines) connecting the pixels PXL and the driving unit to each other may be provided on the non-display area NEA. The driving unit may include a scan driving circuit GDC (e.g., see FIG. 2) and a driving circuit chip DIC. However, the present disclosure is not limited thereto.

The pixels PXL may be provided in the display area EA of the substrate SUB. Each of the pixels PXL may be a minimum unit for displaying an image. Each of the pixels PXL may include a light emitting element for emitting white light and/or colored light. Each of the pixels PXL may emit light of any one desired color from among red, green, and/or blue. However, the present disclosure is not limited thereto, and each of the pixels PXL may emit light of a desired color, such as cyan, magenta, or yellow.

The pixels PXL may be arranged in a matrix form along rows (e.g., pixel rows) extending in the first direction DR1, and columns (e.g., pixel columns) extending in the second direction DR2 crossing or intersecting the first direction DR1. However, the arrangement form of the pixels PXL is not particularly limited thereto, and the pixels PXL may be arranged in various suitable forms. In the drawings, the pixels PXL are illustrated as having a rectangular shape. However, the present disclosure is not limited thereto, and the pixels PXL may have various suitable shapes. In addition, when a plurality of pixels PXL are provided, the plurality of pixels PXL may be provided to have different areas (e.g., sizes) from one another. For example, in the case of the pixels PXL emitting different colors of light from each other, the pixels PXL may be provided to have different areas (e.g., different sizes) from each other, or may have different shapes from each other depending on each color.

Figure 5:
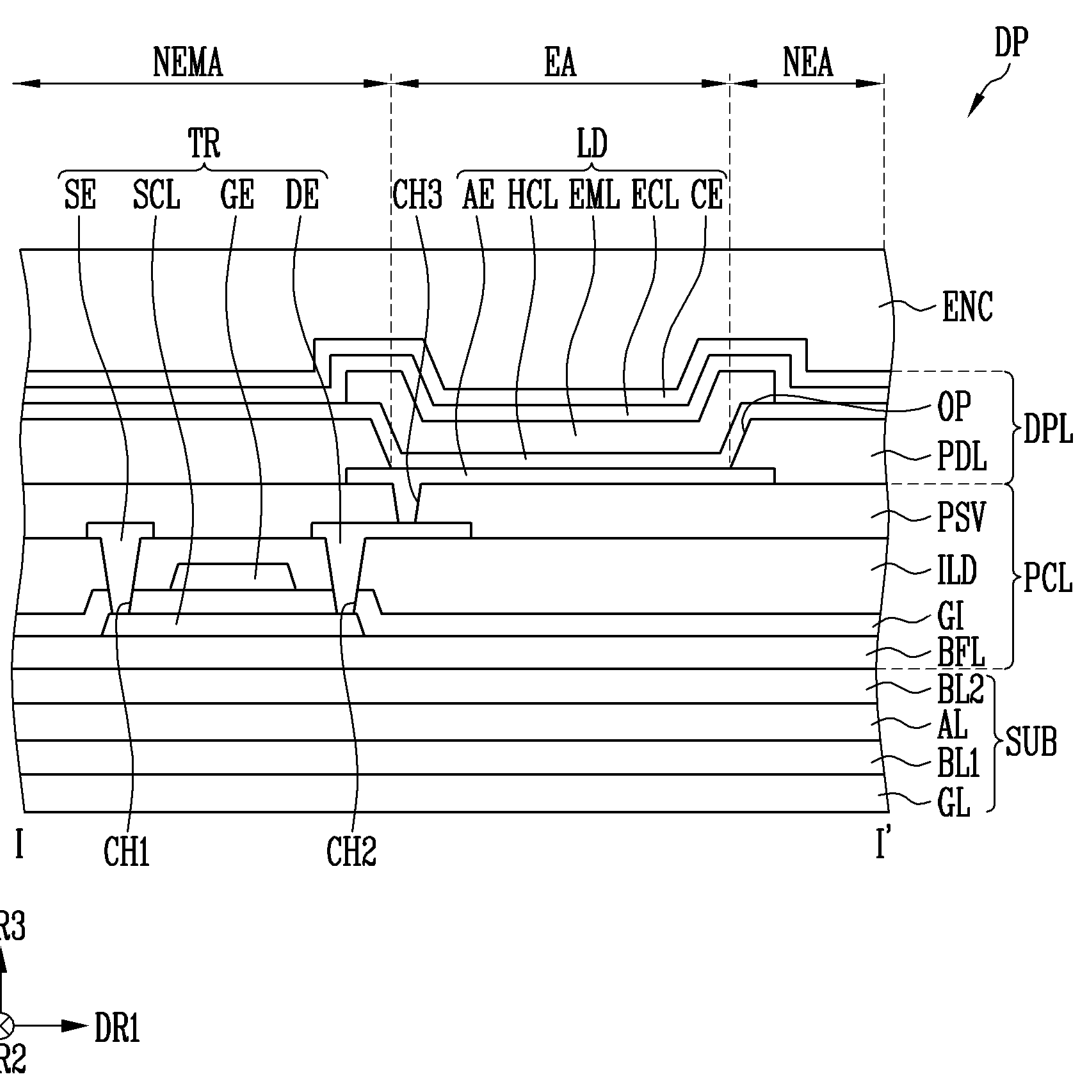
FIG. 5 is a sectional view of the display panel taken along the line I-I' of FIG. 2.

FIG. 5 is a sectional view of the display panel taken along the line I-I' of FIG. 2.

Referring to FIG. 5, the display panel DP may include a substrate SUB, a pixel circuit layer PCL, a display element layer DPL, and an encapsulation layer ENC.

The substrate SUB, the pixel circuit layer PCL, the display element layer DPL, and the encapsulation layer ENC, which are shown in FIG. 5, may be the same or substantially the same as the substrate SUB, the pixel circuit layer PCL, the display element layer DPL, and the encapsulation layer ENC described above with reference to FIG. 3. Accordingly, redundant description thereof may not be repeated.

The substrate SUB may include a ground layer GL, a first base layer BL1, an adhesive layer AL, and a second base layer BL2.

The ground layer GL may be a rear surface of the substrate SUB. For example, the first base layer BL1, the adhesive layer AL, and the second base layer BL2 may be sequentially disposed on the ground layer GL. However, the present disclosure is not limited thereto. For example, hereinafter, the ground layer GL is described in more detail as a component of the substrate SUB. However, the ground layer GL may be a component separate from the substrate SUB. For example, the ground layer GL may be disposed on the rear surface of the substrate SUB.

The ground layer GL may weaken the intensity of electromagnetic waves introduced from the outside. For example, the ground layer GL may have a ground potential. Accordingly, the ground layer GL may absorb at least a portion of the electromagnetic waves introduced from the outside. The electromagnetic waves absorbed by the ground layer GL may be converted into electric and magnetic energy, and may weaken the intensity of the electromagnetic waves introduced from the outside. In some embodiments, the ground layer GL may absorb a portion of electromagnetic waves formed in the display panel DP and/or the printed circuit board PCB (e.g., see FIG. 2).

The ground layer GL may include copper (Cu). However, the present disclosure is not limited thereto. For example, the ground layer GL may include at least one metal from among various suitable metal materials including aluminum (Al), silver (Ag), magnesium (Mg), platinum (Pt), palladium (Pd), gold (Au), nickel (Ni), neodymium (Nd), iridium (Ir), chromium (Cr), titanium (Ti), molybdenum (Mo), and the like, or any suitable alloy including the same, or may be formed as a multi-layered structure or a single layer, which includes a corresponding material.

The first base layer BL1 may be disposed on the ground layer GL. The first base layer BL1 may include a suitable material having a flexibility. For example, the first base layer BL1 may include polyimide (PI). However, the present disclosure is not limited thereto. For example, the first base layer BL1 may include polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (CTA), and/or cellulose acetate propionate (CAP). Also, the first base layer BL1 may include an inorganic insulating material, such as silicon oxide, silicon oxynitride, and/or silicon nitride.

The adhesive layer AL may be disposed on the first base layer BL1. The adhesive layer AL may be disposed between the first base layer BL1 and the second base layer BL2. Accordingly, the adhesive layer AL may allow the first base layer BL1 and the second base layer BL2 to be adhered to each other.

The adhesive layer AL may be formed of a silicon layer. For example, the adhesive layer AL may include amorphous silicon, silicon oxide, silicon nitride, and/or the like. However, the present disclosure is not limited thereto.

The second base layer BL2 may be disposed on the adhesive layer AL. The second base layer BL2 may include a suitable material having a flexibility. The second base layer BL2 may include (e.g., may be made of) the same material as that of the first base layer BL1. For example, the second base layer BL2 may include polyimide.

The pixel circuit layer PCL may include a buffer layer, a gate insulating layer GI, an interlayer insulating layer ILD, and a passivation layer PSV, which are sequentially stacked on the substrate SUB along the third direction DR3.

The buffer layer BFL may be entirely disposed on the substrate SUB. The buffer layer BFL may prevent or substantially prevent an impurity from being diffused into a transistor TR. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), or aluminum oxide ($AlO_x$). The buffer layer BFL may be provided as a single layer, but may be provided as a multi-layered structure including at least two layers. When the buffer layer BFL is provided as the multi-layered structure, the layers may be formed of the same material as each other, or may be formed of different materials from each other. The buffer layer BFL may be omitted as needed or desired according to a material of the substrate SUB, a process condition, and/or the like.

The gate insulating layer GI may be entirely disposed on the buffer layer BFL. The gate insulating layer GI may include the same material as that of the buffer layer BFL, or may include a material appropriate (e.g., selected) from the materials described above for the buffer layer BFL. In an example, the gate insulating layer GI may be an inorganic insulting layer including an inorganic material.

The interlayer insulating layer ILD may be entirely provided and/or formed on the gate insulating layer GI. The interlayer insulating layer ILD may include the same material as that of the gate insulating layer GI, or may include a material appropriate (e.g., selected) from the materials described above for the gate insulating layer GI.

The passivation layer PSV may be entirely provided and/or formed on the interlayer insulating layer ILD. The passivation layer PSV may be an inorganic insulating layer including an inorganic material, or an organic insulating layer including an organic material. The inorganic insulating layer may include, for example, at least one of silicon oxide ($SiO_x$), silicon nitride ($SiN_x$), silicon oxynitride ($SiO_xN_y$), or aluminum oxide ($AlO_x$). The organic insulating layer may include, for example, an organic insulating material, such as an acrylic resin, an epoxy resin, a phenolic resin, a polyamide resin, a polyimide resin, an unsaturated polyester resin, a poly-phenylene ether resin, a poly-phenylene sulfide resin, or a benzocyclobutene (BCB) resin.

The transistor TR may include a semiconductor layer SCL, a gate electrode GE, a source electrode SE, and a drain electrode DE.

The semiconductor layer SCL may be disposed on the buffer layer BFL. The semiconductor layer SCL may include a source region and a drain region, which are in contact with the source electrode SE and the drain electrode DE, respectively. A region between the source region and the drain region may be a channel region.

The semiconductor layer SCL may be a semiconductor pattern including (e.g., made of) amorphous silicon, monocrystalline silicon, polycrystalline silicon, an oxide semiconductor, and/or the like. The channel region may be an intrinsic semiconductor pattern that is undoped with an impurity. Impurities, such as an n-type impurity, a p-type impurity, and other suitable metals, may be used as the impurity. The source and drain regions may correspond to a semiconductor pattern that is doped with the impurity.

The gate electrode GE may be located on the gate insulating layer GI. The gate electrode GE may overlap with the semiconductor layer SCL corresponding to the gate electrode GE.

The source electrode SE may be located on the interlayer insulating layer ILD, thereby being in contact with the source region of the semiconductor layer SCL, which corresponds to the source electrode SE, through a contact hole penetrating the interlayer insulating layer ILD and the gate insulating layer GI. In an example, the source electrode SE of the transistor TR may be in contact with the source region of the semiconductor layer SCL, which corresponds to the source electrode SE, through a first contact hole CH1 penetrating the interlayer insulating layer ILD and the gate insulating layer GI.

The drain electrode DE may be located on the interlayer insulating layer ILD, thereby being in contact with the drain region of the semiconductor layer SCL, which corresponds to the drain electrode DE, through a contact hole penetrating the interlayer insulating layer ILD and the gate insulating layer GI. In an example, the drain electrode DE of the transistor TR may be in contact with the drain region of the semiconductor layer SCL, which corresponds to the drain electrode DE, through a second contact hole CH2 penetrating the interlayer insulating layer ILD and the gate insulating layer GI.

The passivation layer PSV may be entirely disposed over the transistor TR. Accordingly, the passivation layer PSV may cover the transistor TR. The passivation layer PSV may include a third contact hole CH3 exposing a portion of the drain electrode DE.

The display element layer DPL may be disposed on the passivation layer PSV. The display element layer DPL may include a light emitting element LD.

The light emitting element LD may include first and second electrodes AE and CE, and a light emitting layer EML provided between the two electrodes AE and CE. Any one of the first or second electrodes AE or CE may be an anode, and the other of the first and second electrodes AE and CE may be a cathode. For example, the first electrode AE may be the anode, and the second electrode CE may be the cathode. When the light emitting element LD is a top emission organic light emitting element, the first electrode AE may be a reflective electrode, and the second electrode CE may be a transmissive electrode. In an embodiment, the light emitting element LD may be the top emission organic light emitting element, and the first electrode AE may be the anode.

The first electrode AE may be electrically connected to the drain electrode DE through the third contact hole CH3 penetrating the passivation layer PSV. The first electrode AE may include a reflective layer capable of reflecting light, and a transparent conductive layer disposed on the top or the bottom of the reflective layer. At least one of the transparent conductive layer or the reflective layer may be electrically connected to the drain electrode DE.

The display element layer DPL may further include a pixel defining layer PDL having an opening OP exposing a portion of the first electrode AE (e.g., a portion of a top surface of the first electrode AE).

Each of the pixels PXL provided in the display panel DP may be disposed in a pixel area included in the display area EA. In an embodiment, the pixel area may include an emission area EMA, and a non-emission area NEA adjacent to the emission area EMA. The non-emission area NEA may surround (e.g., around a periphery of) the emission area EMA. In an embodiment, the emission area EMA may be defined to correspond to a partial area of the first electrode AE that is exposed by the opening OP of the pixel defining layer PDL.

The display element layer DPL may include a hole control layer HCL and an electron control layer ECL.

The hole control layer HCL may be commonly disposed in the emission area EMA and the non-emission area NEA. Common layers, such as the hole control layer HCL and the electron control layer ECL, may be commonly formed in the plurality of pixels PXL.

The light emitting layer EML may be disposed on the hole control layer HCL. The light emitting layer EML may be disposed in an area corresponding to the opening OP. In other words, the light emitting layer EML may be separately provided in each of the plurality of pixels PXL. The light emitting layer EML may include an organic material and/or an inorganic material. In an embodiment, the light emitting layer EML may be formed through patterning. However, in some embodiments, the light emitting layer EML may be commonly provided in the pixels PXL. The color of light generated in the light emitting layer EML may be one of red, green, blue, or white. However, the present disclosure is not limited thereto. For example, the color of light generated in the light emitting layer EML may be one of magenta, cyan, or yellow.

The electron control layer ECL may be provided on the light emitting layer EML. The electron control layer ECL may be commonly formed in the pixels PXL, and may inject and/or transport into the light emitting layer EML.

The second electrode CE may be provided on the electron control layer ECL. The second electrode CE may be commonly provided in the pixels PXL.

The encapsulation layer ENC covering the second electrode CE may be provided over the second electrode CE.

The encapsulation layer ENC may be provided as a single layer, but may be provided as a multi-layered structure. The encapsulation layer ENC may include a plurality of insulating layers covering the light emitting element LD. In more detail, the encapsulation layer ENC may include at least one inorganic layer and at least one organic layer. For example, the encapsulation layer ENC may have a structure in which the inorganic layer and the organic layer are alternately stacked. In some embodiments, the encapsulation layer ENC may be an encapsulation substrate that is disposed over the light emitting element LD, and bonded to the substrate SUB through a sealant.

Figure 6:
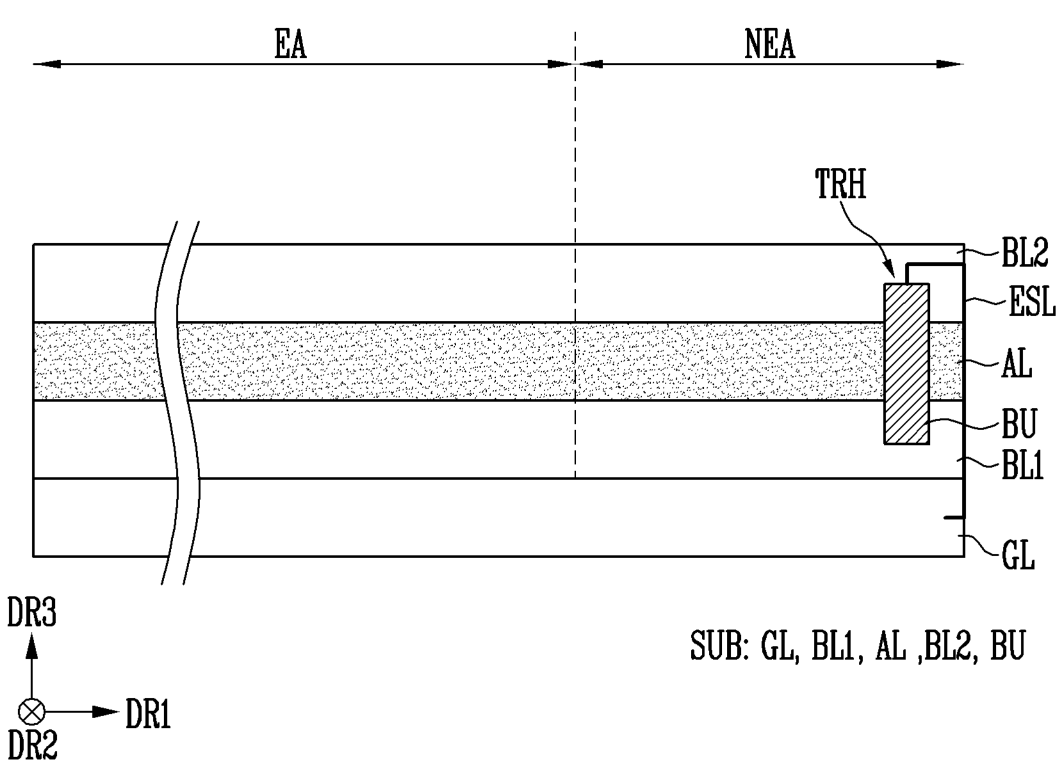
FIG. 6 is a sectional view illustrating an embodiment of the substrate shown in FIG. 5.

FIG. 6 is a sectional view illustrating an embodiment of the substrate shown in FIG. 5.

Referring to FIG. 6, the substrate SUB may include a ground layer GL, a first base layer BL1, an adhesive layer AL, a second base layer BL2, and a barrier unit (e.g., a barrier or a conductive barrier) BU. The ground layer GL, the first base layer BL1, the adhesive layer AL, and the second base layer BL2 of FIG. 6 may be the same or substantially the same as the ground layer GL, the first base layer BL1, the adhesive layer AL, and the second base layer BL2 described above with reference to FIG. 5. Accordingly, redundant description thereof may not be repeated hereinafter.

The adhesive layer AL may include at least one trench TRH. For example, the adhesive layer AL may include a trench TRH penetrating at least a partial area of the adhesive layer AL.

The barrier unit BU may be disposed on the trench TRH. For example, the barrier unit BU may be disposed on the trench TRH to penetrate the adhesive layer AL. The barrier unit BU may be in contact with the first base layer BL1 and the second base layer BL2, while penetrating the adhesive layer AL.

The barrier unit BU may be disposed to overlap with the non-display area NEA. The barrier unit BU may be disposed not to overlap with the display area EA. For example, the barrier unit BU may overlap with an outer area of the substrate SUB, which does not overlap with the display area EA.

The barrier unit BU may have an electrical conductivity higher than an electrical conductivity of the adhesive layer AL. For example, static electricity introduced into the adhesive layer may move to the barrier unit BU. In other words, the barrier unit BU may discharge the static electricity introduced into the adhesive layer AL to the ground layer GL.

The barrier unit BU may be connected to the ground layer GL. For example, the barrier unit BU may be connected to the ground layer GL through a connection line ESL. The connection line ESL may be disposed to overlap with the non-display area NEA. However, the present disclosure is not limited thereto, and the connection line ESL may be variously modified as needed or desired, as long as the connection line ESL is capable of connecting the barrier unit BU and the ground layer GL to each other.

The barrier unit BU may allow the substrate SUB to maintain a constant or substantially constant level of a potential. For example, the barrier unit BU may include a dielectric material, and the adhesive layer AL may include (e.g., may be made of) amorphous silicon to have a relatively high dielectric constant. In some embodiments, the barrier unit (BU) may include at a least one of ceramic, glass or plastic. Static electricity (e.g., electromagnetic waves) generated from the display device DD (e.g., see FIG. 1) or from the outside may be introduced into the display panel DP (e.g., see FIG. 5). The static electricity may charge the adhesive layer AL (e.g., the silicon included in the adhesive layer AL). The charged adhesive layer AL may have an influence on an operation of the transistor TR (e.g., see FIG. 5), and may deteriorate a reliability of driving of the display panel DP.

In accordance with some embodiments of the present disclosure, the barrier unit BU may relatively reduce a risk that static electricity will be generated in the substrate SUB. For example, the barrier unit BU may be connected to the ground layer GL having the ground potential. The barrier unit BU may enable the static electricity introduced into the substrate SUB to flow into the ground layer GL, and thus, the reliability of driving of the display device DD may be improved.

Figure 7:
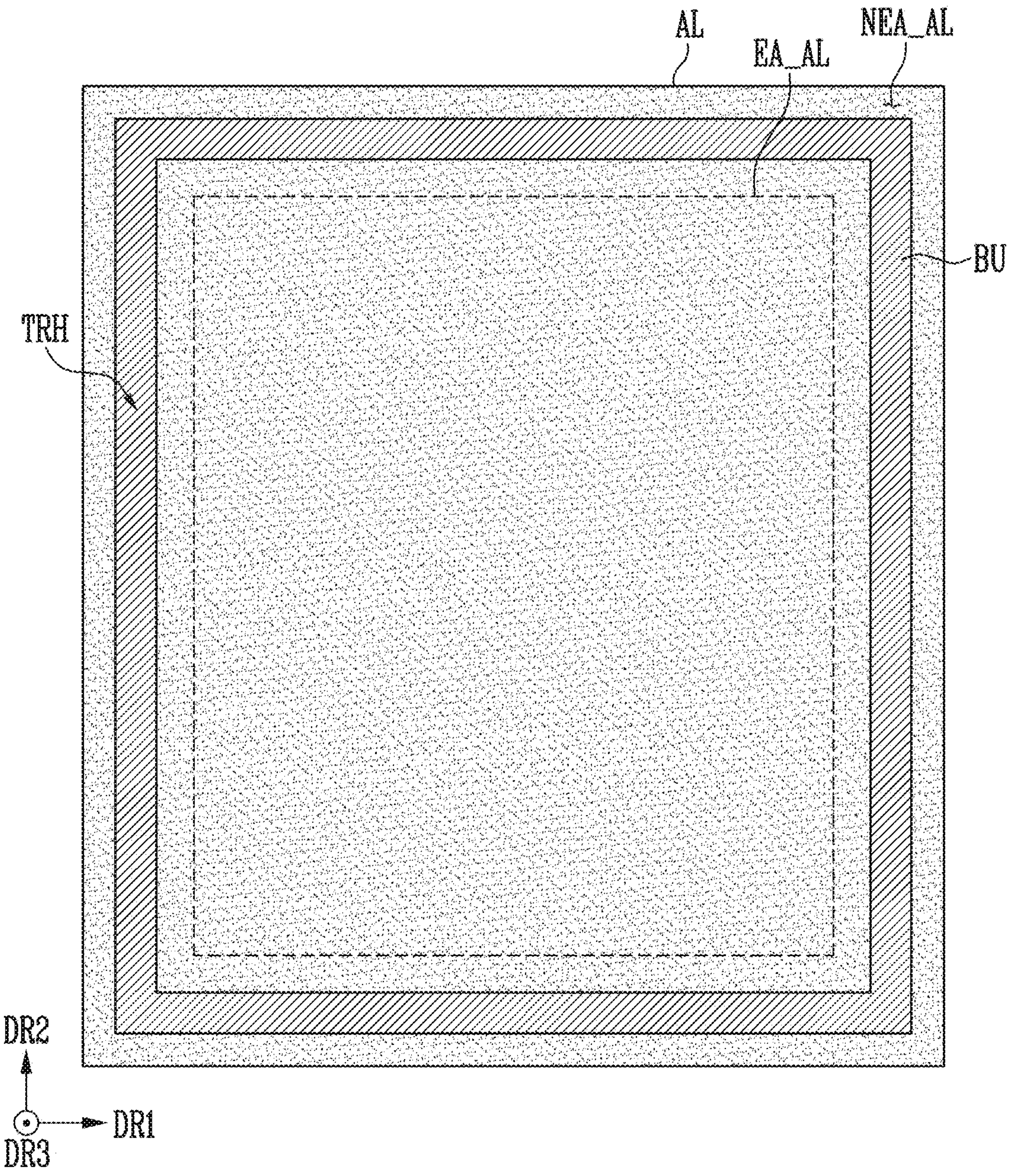
FIG. 7 is a plan view illustrating an embodiment of an adhesive layer and a barrier unit shown in FIG. 6.
Figure 8:
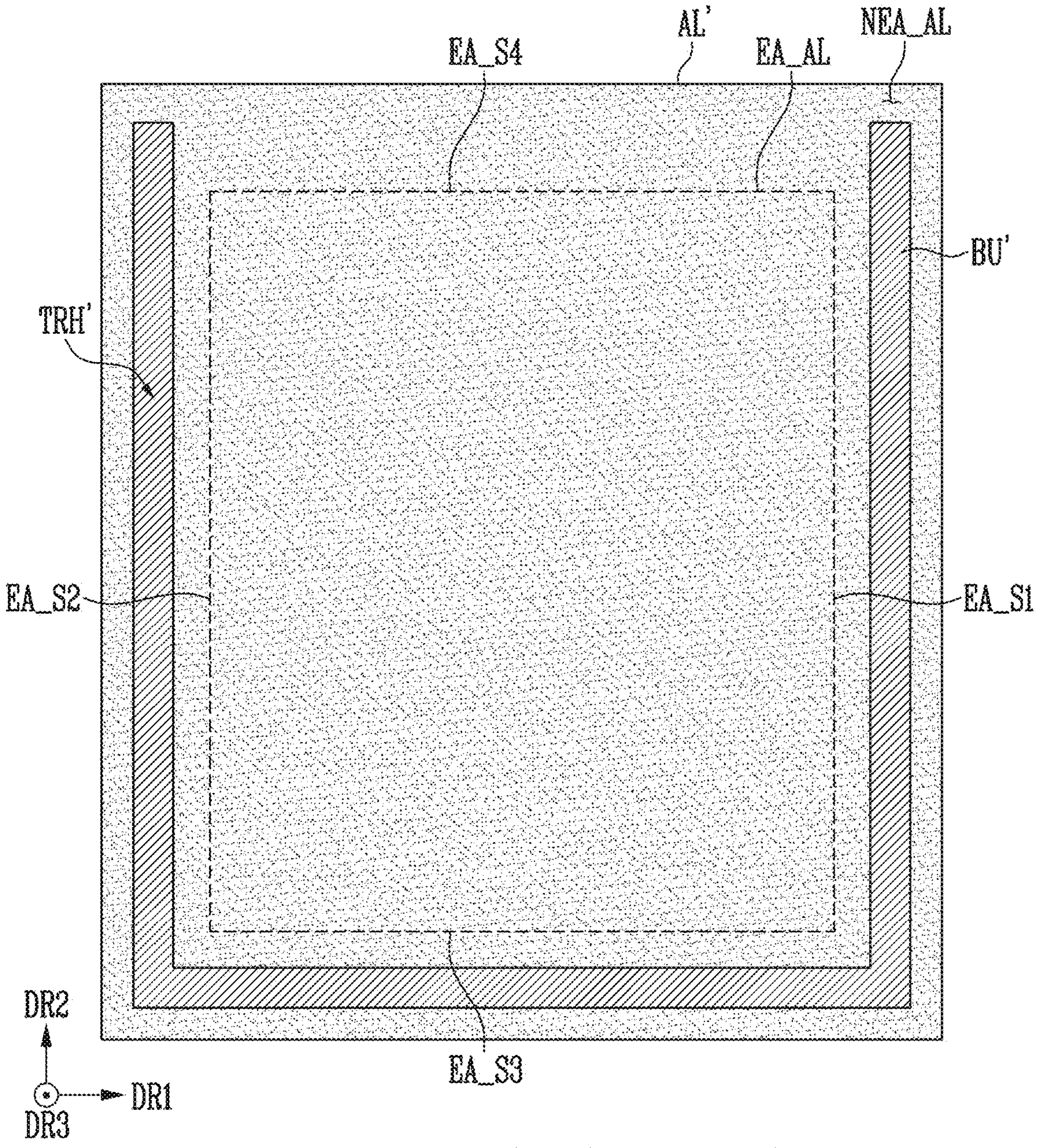
FIG. 8 is a plan view illustrating an embodiment of an adhesive layer and a barrier unit shown in FIG. 6.
Figure 9:
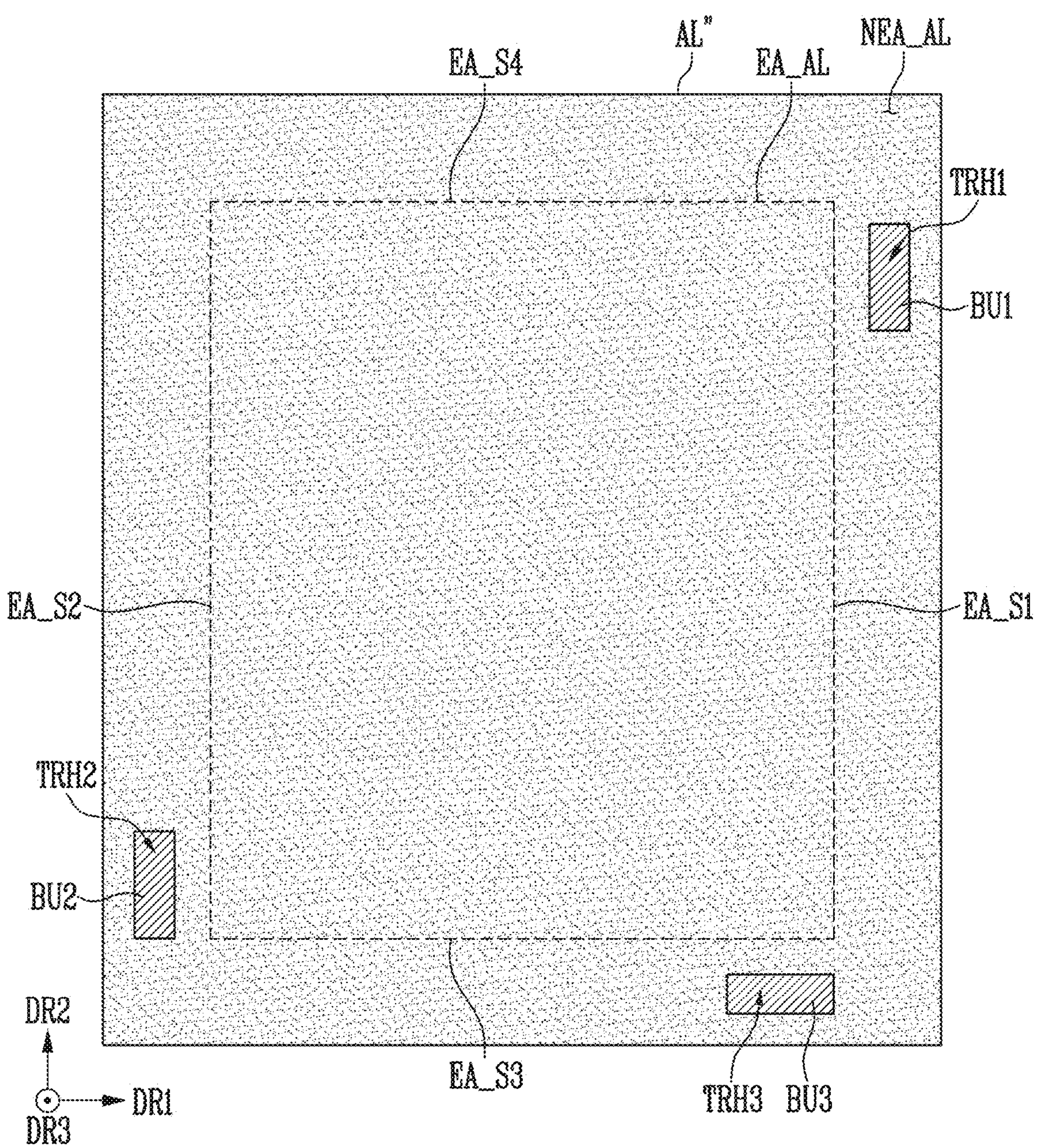
FIG. 9 is a plan view illustrating an embodiment of an adhesive layer and a barrier unit shown in FIG. 6.

FIG. 7 is a plan view illustrating an embodiment of the adhesive layer and the barrier unit shown in FIG. 6. FIG. 8 is a plan view illustrating an embodiment of the adhesive layer and the barrier unit shown in FIG. 6. FIG. 9 is a plan view illustrating an embodiment of the adhesive layer and the barrier unit shown in FIG. 6.

In each of FIGS. 7 to 9, for convenience of illustration, the adhesive layer AL and the barrier unit BU of the substrate SUB (e.g., see FIG. 6), which are viewed in the opposite direction of the third direction DR3 (e.g., in a plan view), are shown.

Referring to FIG. 7, the adhesive layer AL may include a display area EA_AL and a non-display area NEA_AL. The display area EA_AL and the non-display area NEA_AL, which are shown in FIG. 7, may be areas corresponding to the display area EA and the non-display area NEA described above with reference to FIG. 6. For example, the display area EA_AL may be an area overlapping with the display area EA on a plane (e.g., in a plan view). In addition, the non-display area NEA_AL may be an area overlapping with the non-display area NEA on a plane (e.g., in a plan view). The non-display area NEA_AL may be formed to surround (e.g., around a periphery of) the display area EA_AL. For example, the display area EA_AL and the non-display area NEA_AL may have a quadrangular shape. However, the present disclosure is not limited thereto.

The adhesive layer AL may include a trench TRH recessed in the third direction DR3. The trench TRH may be an opening that is recessed in a thickness direction of the adhesive layer AL, and extends in one direction. For example, the trench TRH may be an opening that is recessed in the opposite direction of the third direction DR3, and extends in the first direction DR1 and/or the second direction DR2. The trench TRH may be formed as one opening surrounding (e.g., around a periphery of) the display area EA_AL. However, the present disclosure is not limited thereto. For example, the trench TRH may be configured with four trenches TRH, and the trenches TRH may be connected to each other to surround (e.g., around a periphery of) the display area EA_AL.

The trench TRH may be disposed on the non-display area NEA_AL. The trench TRH may not overlap with the display area EA_AL, but may be disposed on the non-display area NEA_AL.

The trench TRH may be disposed to surround (e.g., around a periphery of) the display area EA_AL. For example, the trench TRH may be disposed outside the display area EA_AL, and may be disposed to surround (e.g., around a periphery of) all sides of the display area EA_AL.

A barrier unit (e.g., a barrier or a conductive barrier) BU may be disposed to correspond to the trench TRH. In other words, the barrier unit BU may be disposed, while overlapping with the trench TRH, to penetrate the adhesive layer AL.

The barrier unit BU may be disposed on the non-display area NEA_AL. For example, the barrier unit BU may not overlap with the display area EA_AL, but may be disposed on the non-display area NEA_AL.

The barrier unit BU may be connected to the ground layer GL. For example, the barrier unit BU may be connected to the ground layer GL through the connection line ESL (e.g., see FIG. 6). Accordingly, the barrier unit BU may transfer static electricity introduced from the outside to the ground layer GL.

The barrier unit BU may be disposed to surround (e.g., around a periphery of) the display area EA_AL. Accordingly, the barrier unit BU may enable the static electricity introduced from the outside to not flow into the display area EA_AL. In other words, the barrier unit BU may prevent or substantially prevent the static electricity introduced from the outside from flowing into the display area EA_AL. For example, the display area EA_AL may have a quadrangular shape. The barrier unit BU may be disposed to surround (e.g., around a periphery of) four sides of the display area EA_AL. Accordingly, the barrier unit BU may reduce a risk that the static electricity will be introduced into the display area EA_AL.

Referring to FIG. 8, an adhesive layer AL' may include a trench TRH'. For example, the adhesive layer AL' may include the trench TRH' that is recessed in the third direction DR3. The trench TRH' may be an opening that is recessed in a thickness direction of the adhesive layer AL', and extends in one direction. The adhesive layer AL', the trench TRH', and a barrier unit (e.g., a barrier or a conductive barrier) BU', which are shown in FIG. 8, may be the same or substantially the same as the adhesive layer AL, the trench TRH, and the barrier unit BU described above with reference to FIG. 7. As such, redundant description thereof may not be repeated hereinafter.

The trench TRH' may be disposed on the non-display area NEA_AL. The trench TRH' may have a U shape on a plane (e.g., in a plan view). In other words, the adhesive layer AL' may include an opening having a U shape.

The display area EA_AL may have a quadrangular shape. The display area EA_AL may include a plurality of sides EA_S. For example, the display area EA_AL may include first to fourth sides EA_S1 to EA_S4.

The first side EA_S1 may be a side of the display area EA_AL in the first direction DR1 from among the plurality of sides EA_S. The second side EA_S2 may be a side of the display area EA_AL in the opposite direction of the first direction DR1 from among the plurality of sides EA_S. The second side EA_S2 may be a side facing (or opposite from) the first side EA_S1. The third side EA_S3 may be a side of the display area EA_AL in the opposite direction of the second direction DR2 from among the plurality of sides EA_S. The fourth side EA_S4 may be a side of the display area EA_AL in the second direction DR2 from among the plurality of sides EA_S. The fourth side EA_S4 may be a side facing (or opposite from) the third side EA_S3.

The barrier unit BU' may have a shape corresponding to the trench TRH'. For example, the barrier unit BU' may have a U shape on a plane (e.g., when viewed from an upper side or in a plan view). The barrier unit BU' may be disposed to surround (e.g., around a periphery of) the first to third sides EA_S1 to EA_S3. The barrier unit BU' may not surround (e.g., around a periphery of) the fourth side EA_S4. The fourth side EA_S4 may be a side at which the driving circuit chip DIC (e.g., see FIG. 2) of the display device DD (e.g., see FIG. 1) may be disposed. Accordingly, an amount of static electricity introduced via the fourth side EA_S4 from an outside may be relatively small. In accordance with some embodiments of the present disclosure, although the barrier unit BU' is disposed to surround (e.g., around a periphery of) only the first to third sides EA_S1 to EA_S3, the introduction of static electricity from the outside may be effectively blocked.

Referring to FIG. 9, an adhesive layer AL" may include a trench TRH". For example, the adhesive layer AL" may include first to third trenches TRH1 to TRH3. The adhesive layer AL", the trench TRH", and a barrier unit (e.g., a barrier or a conductive barrier) BU", which are shown in FIG. 9, may be the same or substantially the same as the adhesive layer AL, the trench TRH, and the barrier unit BU described above with reference to FIG. 7. As such, redundant description thereof may not be repeated hereinafter.

The trench TRH" may include the first to third trenches TRH1 to TRH3. Each of the first to third trenches TRH1 to TRH3 may be disposed adjacent to any one of the sides EA_S of the display area EA. For example, the first trench TRH1 may be disposed adjacent to the first side EA_S1. In other words, the first trench TRH1 may be disposed adjacent to a corner between the first side EA_S1 and the fourth side EA_S4. The second trench TRH2 may be disposed adjacent to the second side EA_S2. In other words, the second trench TRH2 may be disposed adjacent to a corner between the second side EA_S2 and the third side EA_S3. The third trench TRH3 may be disposed adjacent to the third side EA_S3. In other words, the third trench TRH3 may be disposed adjacent to a corner between the first side EA_S1 and the third side EA_S3.

The barrier unit BU" may include first to third barrier units (e.g., first to third barriers or conductive barriers) BU1 to BU3. The first to third barrier units BU1 to BU3 may correspond to the first to third trenches TRH1 to TRH3, respectively. For example, the first barrier unit BU1 may overlap with the first trench TRH1 to be disposed adjacent to the corner between the first side EA_S1 and the fourth side EA_S4. The second barrier unit BU2 may overlap with the second trench TRH2 to be disposed adjacent to the corner between the second side EA_S2 and the third side EA_S3. The third barrier unit BU3 may overlap with the third trench TRH3 to be disposed adjacent to the corner between the first side EA_S1 and the third side EA_S3.

Each of the first to third barrier units BU1 to BU3 may be connected to the ground layer through the connection line ESL (e.g., see FIG. 6). Accordingly, the first to third barrier units BU1 to BU3 may transfer static electricity introduced from the outside to the ground layer GL.

In accordance with some embodiments of the present disclosure, the first to third barrier units BU1 to BU3 may effectively block the static electricity introduced from the outside, while occupying a relatively smaller area on the display area EA_AL. For example, a corner of the display area EA_AL may be relatively weaker to the static electricity introduced from the outside. Each of the first to third barrier units BU1 to BU3 may be disposed to be closer to the corner of the display area EA_AL. Accordingly, the first to third barrier units BU1 to BU3 may effectively transfer static electricity introduced from the outside of the display panel DP (e.g., see FIG. 4) to the ground layer GL, thereby improving the reliability of driving of the display panel DP.

Figure 10:
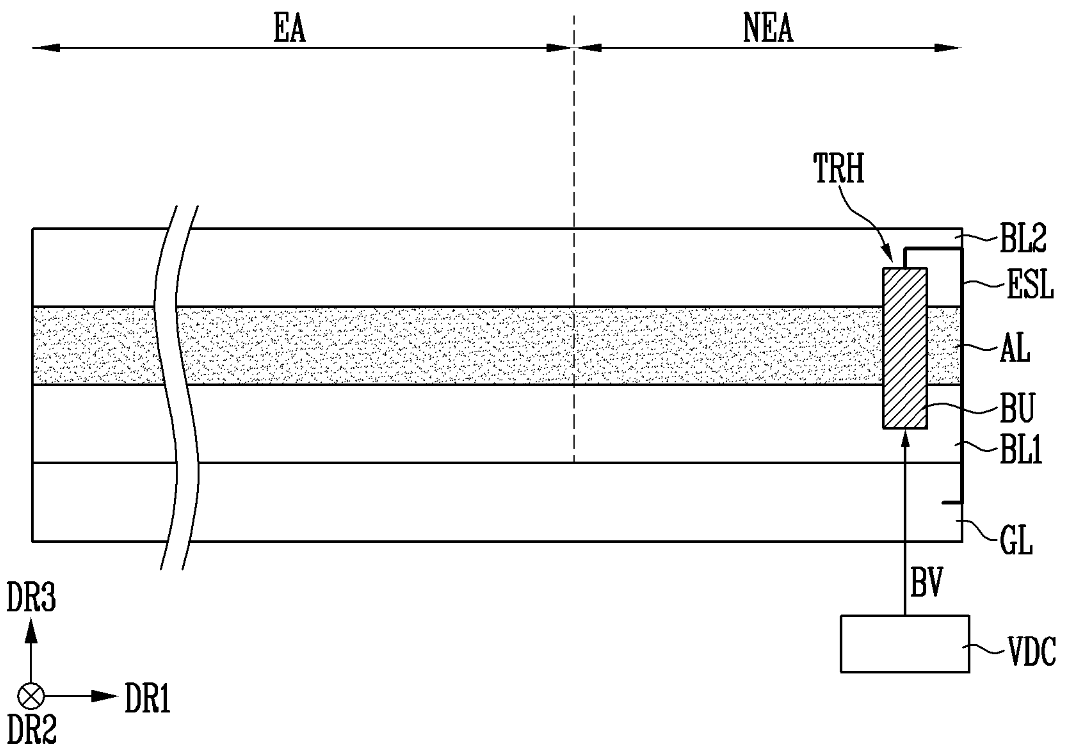
FIG. 10 is a sectional view illustrating an embodiment of the substrate shown in FIG. 5 and a voltage applier.
Figure 11:
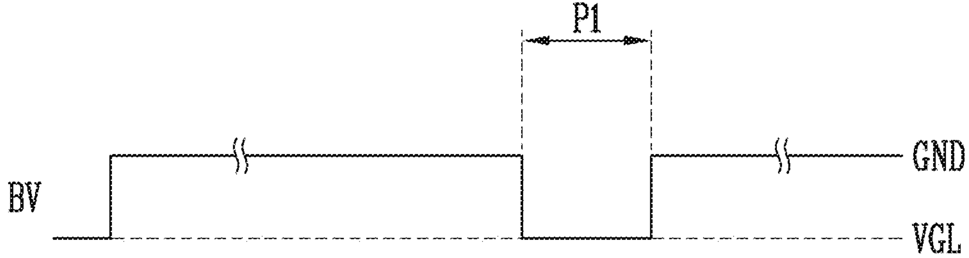
FIG. 11 is a waveform diagram illustrating an embodiment of a bias voltage supplied by the voltage applier shown in FIG. 10.

FIG. 10 is a sectional view illustrating an embodiment of the substrate shown in FIG. 5 and a voltage applier. FIG. 11 is a waveform diagram illustrating an embodiment of a bias voltage supplied by the voltage applier shown in FIG. 10.

Referring to FIG. 10, the substrate SUB may include a ground layer GL, a first base layer BL1, an adhesive layer AL, a second base layer BL2, and a barrier unit (e.g., a barrier or a conductive barrier) BU. The ground layer GL, the first base layer BL1, the adhesive layer AL, and the second base layer BL2, which are shown in FIG. 10, may be the same or substantially the same as the ground layer GL, the first base layer BL1, the adhesive layer AL, and the second base layer BL2 described above with reference to FIG. 6. As such, redundant description thereof may not be repeated hereinafter.

Referring to FIGS. 10 and 11, a bias supplier (e.g., the voltage applier) VDC may supply a voltage (e.g., a predetermined voltage) to the barrier unit BU. For example, the bias supplier VDC may apply a bias voltage BV.

The bias voltage BV may have a ground level voltage GND and a low level voltage VGL. For example, the bias supplier VDC may apply the ground level voltage GND to the barrier unit BU. Accordingly, static electricity introduced from the outside may be transferred to the ground layer GL via the barrier unit BU. Afterwards, the bias supplier VDC may apply the low level voltage VGL to the barrier unit BU during a first period P1 (e.g., during only a first period P1). For example, the static electricity introduced from the outside may have positive charges during the first period P1. When a charge quantity of the static electricity is very large, blocking of the static electricity may not be smoothly made, even though the ground level voltage GND is applied to the barrier unit BU. Accordingly, the substrate SUB may be charged by the static electricity, and the reliability of driving of the display device DD (e.g., see FIG. 1) may deteriorate.

In accordance with some embodiments of the present disclosure, the bias supplier VDC may apply the low level voltage VGL to the barrier unit BU during a period (e.g., the first period P1) in which the charge quantity of the static electricity introduced from the outside is very large. Accordingly, although the charge quantity of the static electricity introduced from the outside is very large, a risk that the substrate SUB will be charged by the static electricity may be reduced.

In some embodiments, the bias voltage BV may be synchronized with a gate signal that the scan driving circuit GDC (e.g., see FIG. 2) applies to the pixel PXL. In other words, the bias voltage BV may be synchronized with a gate signal that the scan driving circuit GDC applies to the gate electrode GE (e.g., see FIG. 5) of the transistor TR included in the pixel PXL. For example, when the gate signal has a high level, the bias voltage BV may be the ground level voltage GND. Also, when the gate signal has a low level, the bias voltage BV may be the low level voltage VGL. However, the present disclosure is not limited thereto.

Figure 12:
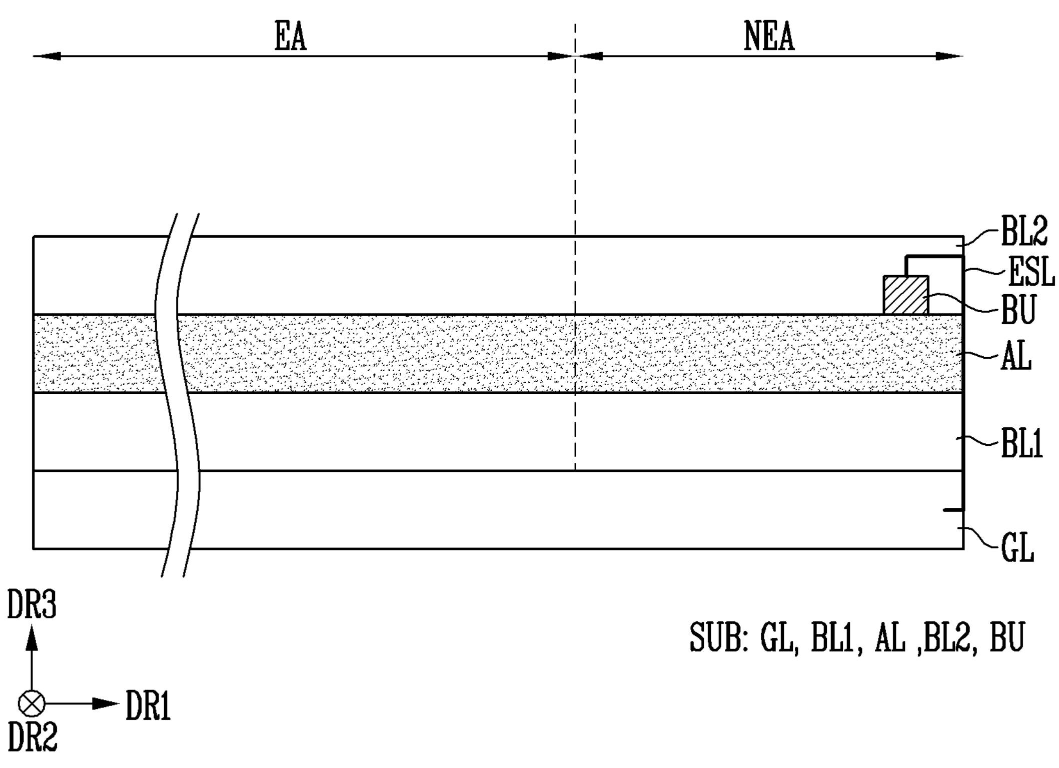
FIG. 12 is a sectional view illustrating an embodiment of the substrate shown in FIG. 5.
Figure 13:
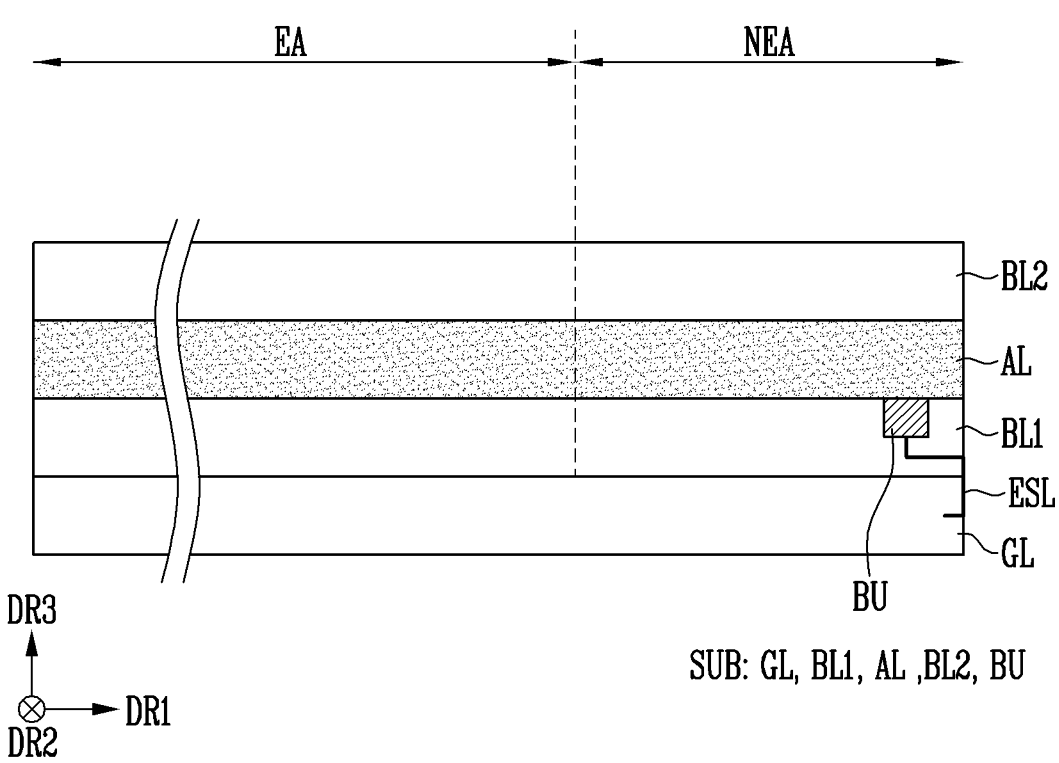
FIG. 13 is a sectional view illustrating an embodiment of the substrate shown in FIG. 5.

FIG. 12 is a sectional view illustrating an embodiment of the substrate shown in FIG. 5. FIG. 13 is a sectional view illustrating an embodiment of the substrate shown in FIG. 5.

Referring to FIGS. 12 and 13, the substrate SUB may include a ground layer GL, a first base layer BL1, an adhesive layer AL, a second base layer BL2, and a barrier unit (e.g., a barrier or a conductive barrier) BU. The ground layer GL, the first base layer BL1, the adhesive layer AL, and the second base layer BL2, which are shown in FIGS. 12 and 13, may be the same or substantially the same as the ground layer GL, the first barrier layer BL1, the adhesive layer AL, and the second barrier layer BL2 described above with reference to FIG. 6. As such, redundant description thereof may not be repeated hereinafter.

The barrier unit BU may be disposed on one surface of the adhesive layer AL. For example, the barrier unit BU may be disposed on a top surface of the adhesive layer AL. In another example, the barrier unit BU may be disposed on a bottom surface of the adhesive layer AL.

The barrier unit BU may be connected to the ground layer GL. For example, the barrier unit BU may be connected to the ground layer GL having a ground potential. Accordingly, the barrier unit BU may allow the substrate SUB to maintain a constant or substantially constant level of a potential. For example, the barrier unit BU may be disposed on the one surface of the adhesive layer AL to receive at least a portion of static electricity charged to the adhesive layer AL. Accordingly, the barrier unit BU enables the received static electricity to flow into the ground layer GL, and the reliability of driving of the display device DD (e.g., see FIG. 1) may be improved.

Figure 14:
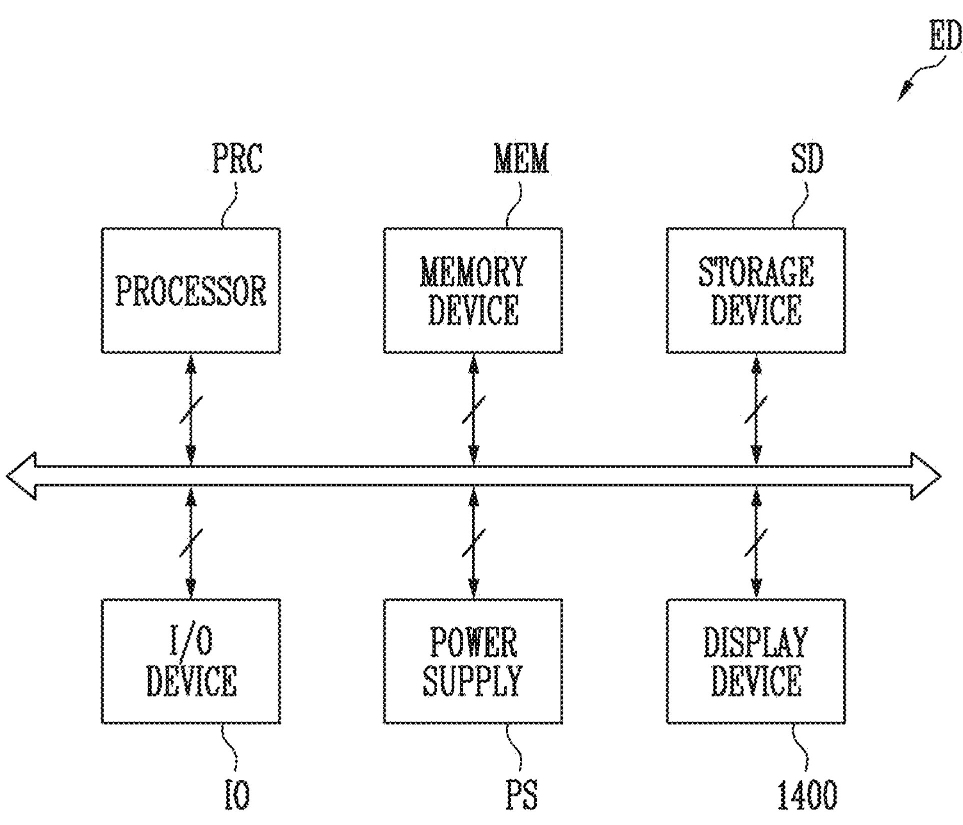
FIG. 14 is a block diagram illustrating an electronic device including a display device in accordance with one or more embodiments of the present disclosure.

FIG. 14 is a block diagram illustrating an electronic device including a display device in accordance with one or more embodiments of the present disclosure.

Referring to FIG. 14, the electronic device ED may include a processor PRC, a memory device MEM, a storage device SD, an input/output (I/O) device IO, a power supply, PS, and a display device 1400. The display device 1400 may be the display device DD described above with reference to FIG. 1. Also, the electronic device ED may further include several ports capable of communicating with a video card, a sound card, a memory card, a USB device, and the like, or communicating with other systems. In an embodiment, the electronic device ED may be implemented as a smartphone. In an embodiment, the electronic device ED may be implemented as a tablet PC. However, the present disclosure is not limited thereto, and the electronic device ED may be any suitable device including the display device DD. For example, the electronic device ED may be implemented as a mobile phone, a video phone, a smart pad, a smart watch, a vehicle navigation system, a computer monitor, a notebook computer, a head mounted display device, or the like.

The processor PRC may perform various calculations or tasks. In some embodiments, the processor PRC may be a microprocessor, a central processing unit, an application processor, or the like. The processor PRC may be connected to the other components through an address bus, a control bus, a data bus, and the like. In some embodiments, the processor PRC may be connected to an extension bus, such as a peripheral component interconnect (PCI) bus.

The memory device MEM may store data used for the operations of the electronic device ED. For example, the memory device MEM may include a nonvolatile memory device, such as an Erasable Programmable Read-Only Memory (EPROM) device, an Electrically Erasable Programmable Read-Only Memory (EEPROM) device, a flash memory device, a Phase Change Random Access Memory (PRAM) device, a Resistance Random Access Memory (RRAM) device, a Nano Floating Gate Memory (NFGM) device, a Polymer Random Access Memory (PoRAM) device, a Magnetic Random Access Memory (MRAM) device, or a Ferroelectric Random Access Memory (FRAM) device, and/or a volatile memory device, such as a Dynamic Random Access Memory (DRAM) device, a Static Random Access Memory (SRAM) device, or a mobile DRAM device.

The storage device SD may include a Solid State Drive (SSD), a Hard Disk Drive (HDD), a CD-ROM, and/or the like.

The I/O device IO may include an input means or device, such as a keyboard, a keypad, a touch screen, or a mouse, and an output means or device, such as a speaker or a printer. In some embodiments, the display device 1400 may be included in the I/O device IO.

The power supply PS may supply power used for the operations of the electronic device ED. For example, the power supply PS may be a power management integrated circuit (PMIC). In some embodiments, the power supply PS may supply the bias voltage BV (e.g., see FIG. 11). For example, the bias supplier VDC (e.g., see FIG. 10) may be a component of the power supply PS. However, the present disclosure is not limited thereto.

The display device 1400 may display an image corresponding to visual information of the electronic device ED. The display device 1400 may be an organic light emitting display device or a quantum dot light emitting display device, but the present disclosure is not limited thereto. The display device 1400 may be connected to the other components through the buses or another communication link.

In the substrate, the display panel, and the display device in accordance with some embodiments of the present disclosure, static electricity introduced from the outside may be stably shielded, thereby improving the reliability of driving of the display device.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A substrate comprising:
a first base layer;
an adhesive layer on the first base layer in a thickness direction of the substrate, the adhesive layer comprising at least one trench;
a second base layer on the adhesive layer; and
a barrier overlapping with the at least one trench,
wherein the at least one trench penetrates the adhesive layer, and
wherein the barrier is entirely spaced from a rear surface of the first base layer by at least a portion of the first base layer overlapping with the barrier in the thickness direction.

2. The substrate of claim 1, wherein the barrier is located on an edge area surrounding a central area of the substrate.

3. The substrate of claim 2, wherein the central area comprises:
a first side;
a second side opposite to the first side;
a third side connected to the first side and the second side; and
a fourth side opposite to the third side, and
wherein the barrier comprises:
a first barrier adjacent to a corner between the first side and the fourth side;
a second barrier adjacent to a corner between the second side and the third side; and
a third barrier adjacent to a corner between the first side and the third side.

4. The substrate of claim 1, wherein the barrier comprises a dielectric material.

5. The substrate of claim 1, wherein the first base layer and the second base layer have a flexibility.

6. The substrate of claim 5, wherein the first base layer and the second base layer comprise polyimide.

7. The substrate of claim 1, wherein the adhesive layer comprises amorphous silicon.

8. A display panel comprising:
a ground layer;
a first base layer on the ground layer;
an adhesive layer on the first base layer in a thickness direction;
a second base layer on the adhesive layer; and
a barrier in contact with one surface of the adhesive layer, and electrically connected to the ground layer,
wherein the barrier is entirely spaced from the ground layer by at least a portion of the first base layer overlapping with the barrier in the thickness direction between the ground layer and the barrier.

9. The display panel of claim 8, wherein the barrier surrounds a display area, and is located on a non-display area different from the display area.

10. The display panel of claim 9, wherein the barrier is in contact with the first base layer.

11. The display panel of claim 9, wherein the barrier is in contact with the second base layer.

12. The display panel of claim 9, wherein the ground layer has a ground potential.

13. An electronic device comprising:
a processor to provide input image data; and
a display device to display an image based on the input image data,
a display device comprising:
a ground layer;
a first base layer;
an adhesive layer on the first base layer in a thickness direction, and comprising at least one trench;
a second base layer on the adhesive layer; and
a barrier overlapping with the at least one trench, and penetrating the adhesive layer,
wherein the barrier is entirely spaced from the ground layer by at least a portion of the first base layer overlapping with the barrier in the thickness direction between the ground layer and the barrier.

14. The electronic device of claim 13, wherein the ground layer has a ground potential.

15. The electronic device of claim 14, wherein the barrier has an electrical conductivity higher than an electrical conductivity of the adhesive layer.

16. The electronic device of claim 13, wherein the barrier surrounds a display area, and is located on a non-display area different from the display area.

17. The electronic device of claim 16, wherein the barrier is electrically connected to the ground layer through a connection line.

18. The electronic device of claim 17, wherein the connection line overlaps with the non-display area.

19. The electronic device of claim 16, further comprising:
a display panel configured to display an image through the display area; and
a data driver configured to supply a data signal to the display panel, and located at one side of the display panel,
wherein the barrier is not located at the one side of the display panel.

20. The electronic device of claim 19, further comprising a bias supplier configured to supply a bias voltage to the barrier,
wherein the bias voltage has a low level voltage during a period.

* * * * *